United States Patent
Stevens (10) Patent No.: US 10,264,689 B2
(45) Date of Patent: Apr. 16, 2019

(54) VAPOR PORTS FOR ELECTRONIC DEVICES

(71) Applicant: HzO, Inc., Draper, UT (US)

(72) Inventor: Blake Stevens, Morristown, NJ (US)

(73) Assignee: HZO, INC., Draper, UT (US)

(*) Notice: Subject to any disclaimer, the term of this patent is extended or adjusted under 35 U.S.C. 154(b) by 213 days.

(21) Appl. No.: 14/103,768

(22) Filed: Dec. 11, 2013

(65) Prior Publication Data

US 2014/0160680 A1 Jun. 12, 2014

Related U.S. Application Data

(60) Provisional application No. 61/735,919, filed on Dec. 11, 2012.

(51) Int. Cl.
| | |
|---|---|
| *H05K 5/02* | (2006.01) |
| *H05K 5/06* | (2006.01) |
| *H05K 7/20* | (2006.01) |
| *G06F 1/20* | (2006.01) |
| *H04M 1/18* | (2006.01) |

(52) U.S. Cl.
CPC ........... *H05K 5/0213* (2013.01); *H04M 1/18* (2013.01); *H05K 5/068* (2013.01); *G06F 1/203* (2013.01); *H05K 7/20009* (2013.01)

(58) Field of Classification Search
CPC ............. H04M 1/0202; H04M 1/0274; H04M 1/72522; H04M 1/18; H05K 5/0213; H05K 5/06–5/09; H04B 1/3888; H04B 1/3833; H04B 2001/3894
USPC ............. 361/679.01, 728, 730, 752, 361/679.46–679.54, 688–723; 455/90, 455/550; 340/604; 174/50, 520; 165/80.1–80.5, 104.33
See application file for complete search history.

(56) References Cited

U.S. PATENT DOCUMENTS

| | | |
|---|---|---|
| 4,194,041 A | 3/1980 | Gore et al. |
| 4,613,544 A | 9/1986 | Burleigh |
| | (Continued) | |

FOREIGN PATENT DOCUMENTS

| | | |
|---|---|---|
| CN | 1650423 A | 8/2005 |
| CN | 102625615 A | 8/2012 |

OTHER PUBLICATIONS

United States Patent and Trademark Office Acting as the International Searching Authority, "International Search Report and Written Opinion," dated Apr. 18, 2014, in related PCT application No. PCT/US2013/074491.

(Continued)

*Primary Examiner* — Zachary Pape (57) ABSTRACT

An electronic device that has components is provided with a housing that defines an exterior and an interior of the electronic device. The housing includes a vapor port that prevents ingress of liquid through the vapor port from the exterior of the electronic device to the interior of the electronic device. The vapor port also permits egress of vapor through the vapor port from the interior of the electronic device to the exterior of the electronic device. The vapor port may include a breathable, but water-resistant or waterproof barrier to prevent water from entering through the barrier while enabling water vapor to exit through the barrier and, thus, the vapor port.

21 Claims, 8 Drawing Sheets

(56) References Cited

U.S. PATENT DOCUMENTS

| | | | | |
|---|---|---|---|---|
| 6,078,792 A * | 6/2000 | Phillips | H04M 1/18 | 455/575.1 |
| 6,261,678 B1 * | 7/2001 | von Fragstein | A41D 31/02 | 428/315.5 |
| 6,327,144 B1 * | 12/2001 | May | G06F 1/203 | 165/104.33 |
| 6,347,034 B1 * | 2/2002 | Holmberg | H05K 5/0213 | 361/600 |
| 6,724,626 B1 * | 4/2004 | Hodes | G06F 1/203 | 165/104.21 |
| 6,827,232 B1 * | 12/2004 | Hara | B29C 45/14336 | 220/371 |
| 6,844,845 B1 * | 1/2005 | Whiteside | H05K 5/061 | 342/357.64 |
| 6,909,602 B2 * | 6/2005 | Dietrich | G06F 1/1616 | 219/209 |
| 6,994,151 B2 | 2/2006 | Zhou et al. | | |
| 7,336,489 B1 * | 2/2008 | Chen | G06F 1/203 | 165/104.33 |
| 7,407,703 B2 * | 8/2008 | DeYoung | B01D 39/083 | 428/306.6 |
| 7,570,492 B2 * | 8/2009 | Gall | H05K 5/0047 | 361/700 |
| 7,667,973 B2 * | 2/2010 | Shinoda | H05K 5/0047 | 174/50 |
| 7,907,401 B2 * | 3/2011 | Bolzmann | H05K 5/0073 | 174/547 |
| 8,472,171 B2 * | 6/2013 | Mongia | F04D 29/4213 | 248/346.01 |
| 8,857,367 B2 * | 10/2014 | Sloey | H01R 13/52 | 116/206 |
| 9,480,189 B2 * | 10/2016 | Kawai | H05K 1/0203 | |
| 9,972,934 B1 * | 5/2018 | Taylor | H01R 13/5227 | |
| 2004/0092696 A1 | 5/2004 | Vedula et al. | | |
| 2005/0070863 A1 * | 3/2005 | Bulow | A61F 5/441 | 604/332 |
| 2006/0087811 A1 * | 4/2006 | He | G06F 1/20 | 361/679.52 |
| 2006/0185515 A1 * | 8/2006 | Hirano | H05K 5/0213 | 96/108 |
| 2007/0215663 A1 * | 9/2007 | Chongson et al. | 224/930 | |
| 2009/0002941 A1 * | 1/2009 | Mongia | G06F 1/20 | 361/690 |
| 2009/0273480 A1 * | 11/2009 | Mittleman | H04M 1/0274 | 340/604 |
| 2009/0324925 A1 | 12/2009 | Conley et al. | | |
| 2010/0255270 A1 * | 10/2010 | Stuebiger | B32B 5/02 | 428/201 |
| 2011/0097571 A1 | 4/2011 | Tee et al. | | |
| 2011/0126613 A1 * | 6/2011 | Lin | G01M 3/10 | 73/40 |
| 2011/0253413 A1 * | 10/2011 | Lu | H05K 5/0213 | 174/50.51 |
| 2012/0051007 A1 * | 3/2012 | Alvarez | H05K 5/0213 | 361/752 |
| 2012/0051015 A1 * | 3/2012 | Dabov | G06F 1/1656 | 361/760 |
| 2012/0271132 A1 | 10/2012 | Hoenes | | |
| 2012/0301917 A1 * | 11/2012 | Mossoba | C12Q 1/04 | 435/38 |
| 2013/0070420 A1 * | 3/2013 | Campbell | H05K 7/20309 | 361/700 |
| 2013/0125956 A1 * | 5/2013 | Furman | F24J 2/4629 | 136/251 |
| 2013/0286567 A1 * | 10/2013 | Sorenson | C23C 16/02 | 361/679.01 |
| 2017/0051769 A1 * | 2/2017 | Hilario | G04B 37/00 | |

OTHER PUBLICATIONS

Gore-Tex® Fabrics 2-Layer, OutdoorsMagic, Dec. 5, 2005, available online at: <URL: http://www.outdoorsmagic.com/gear-news/gore-tex-jacket-giveaway/3615.html>, retrieved Mar. 21, 2014.

Office Action for Taiwan Patent Application No. 1021457, dated Oct. 12, 2015.

* cited by examiner

VAPOR PORTS FOR ELECTRONIC DEVICES

CROSS-REFERENCE TO RELATED APPLICATION

A claim for priority to the Dec. 11, 2012 filing date of U.S. Provisional patent application Ser. No. 13/735,919, titled ELECTRONIC DEVICES AND HOUSINGS THEREFOR WITH VAPOR PORTS ("the '919 Provisional Application"), is hereby made pursuant to 35 U.S.C. § 119(e). The entire disclosure of the '919 Provisional Application is hereby incorporated herein.

TECHNICAL FIELD

This disclosure relates generally to moisture-resistant and moisture-proof electronic devices and, more particularly, to electronic devices with vapor ports that prevent the ingress of liquids, such as water, but allow the egress of gases and vapors, such as water vapor.

BACKGROUND OF RELATED ART

The durability of electronic devices is a major concern to consumers. Protective cases for cell phones, tablets, laptops and other electronic devices are in high demand. Many of these cases protect against scratches and other physical damage, but few protect against damage caused by moisture (e.g., water, water vapor, liquids, vapors of other liquids, etc.), such as electrical shorting, corrosion, contamination and the like. Those cases that do protect against moisture damage generally do so by ensuring that the electronic device is not exposed to moisture; a typical case that protects against water damage envelops and seals the entire electronic device. Waterproof cases are often bulky, and increase the dimensions of the electronic devices they are intended to protect.

The housings of some electronic devices are designed to prevent the ingress of water. A variety of features may be used to create moisture-tight seals at locations of a housing that are vulnerable to ingress of moisture. Electronic devices with sealed housings are often referred to as "waterproof devices." Existing waterproof devices may have designs that prevent the ingress of liquids, such as water, but they also typically prevent the egress of water and other liquids that may be trapped within the interior of a waterproof device.

Some companies, such as HzO, Inc. ("HzO"), take a different approach to protecting electronic devices from moisture. HzO applies a thin film coating to circuitry and components inside an electronic device to provide protection from moisture and other potentially damaging factors. This thin film protects the electronic device from moisture without the need for seals and other features that could undesirably add to the size of the electronic device. The HzO coating protects the electronic device from accidental exposure to moisture, even if the electronic device is dropped in water, rained on or otherwise exposed to potentially damaging levels of moisture.

Whether or not an electronic device has a waterproof housing or has been treated with an internal moisture-resistant coating, allowing a wet electronic device to properly dry after exposure to moisture is often important. Once moisture gets into an electronic device, regardless of whether the electronic device includes moisture-resistant features, moisture can still damage the electronic device.

SUMMARY

As used herein, the term "moisture" includes various types of liquids, such as water, aqueous solutions (e.g., salt solutions, acidic solutions, basic solutions, drinks, etc.) and organic liquids (e.g., organic solvents, other organic materials, etc.), as well as vapors (e.g., humidity, fogs, mists, etc.) of various types of moisture and wetness caused by moisture.

The phrase "moisture resistant" refers to the ability of a coating or other structure to prevent or limit exposure of a coated element or feature to moisture. A moisture resistant coating may resist wetting or penetration by one or more types of moisture, or it may be impermeable or substantially impermeable to one or more types of moisture. A moisture resistant coating may repel one or more types of moisture. The term "moisture resistant" may also refer to the ability of a coating to restrict permeation of or repel organic liquids or vapors (e.g., organic solvents, other organic materials in liquid or vapor form, etc.), as well as a variety of other substances or conditions that might pose a threat to an electronic device or its components.

As used herein, the terms "breathable" and "vapor permeable" are properties of barriers (e.g., fabrics, membranes, etc.) that are substantially impermeable to a liquid of a particular type of moisture, but permeable to vapors of that particular type of moisture, as well as to gases.

This disclosure, in one aspect, relates to approaches for facilitating the egress of moisture from an electronic device. The housing of an electronic device defines both an exterior and an interior of the electronic device. The housing also carries, directly or indirectly, a plurality of components of the electronic device. Many of the components are at least partially contained within the interior of the electronic device, while some of the components may be partially exposed to the exterior of the electronic device. In addition to the housing and components, an electronic device may also include one or more features that prevent the ingress of liquids from the exterior of the electronic device, through the housing, and into the interior of the electronic device, while enabling gases and vapors to readily escape from the interior of the electronic device, through the housing, to the exterior of the electronic device. Such a feature is referred to herein as a "vapor port."

Various embodiments of vapor ports are within the scope of this disclosure, as are electronic devices with vapor ports at a variety of different locations. Without limitation, one or more vapor ports may be formed through the housing of an electronic device to enable vapor to escape from the interior of the electronic device. As another option, one or more seams in the housing of an electronic device may comprise a vapor port, which may prevent liquid from entering into the interior of the electronic device while enabling vapor to escape from the interior of the electronic device.

The vapor port of an electronic device may comprise a so-called "breathable" material that is substantially impermeable to liquids, but permeable to gases and vapors. In some embodiments, the vapor port may include a so-called "waterproof/breathable" membrane, which may withstand at least 1,000 millimeters or more of water pressure (i.e., 9.8 kPa) without leaking. One example of such a material is a porous polytetrafluoroethylene (PTFE) film, such as that available from W.L. Gore & Associates, Inc. of Newark, Del. In some embodiments, such a waterproof/breathable membrane may be used alone.

Alternatively, a waterproof/breathable membrane may be part of a laminate structure, such as the fabric marketed by W.L. Gore & Associates as GORE-TEX® and disclosed by U.S. Pat. No. 4,194,041. Such a laminate may include an interior hydrophilic layer and an exterior hydrophobic layer. The interior hydrophilic layer may be wettable and vapor permeable, while the exterior hydrophobic layer may be water-resistant and vapor permeable. Of course, other laminates of hydrophobic and hydrophilic materials may also be used as a barrier.

In another approach, a breathable material may have a composite structure. In a specific embodiment, such a material may include a porous structure (e.g., a woven material, etc.), which may be hydrophobic, with openings that are filled, or infiltrated, with a hydrophilic material. An example of such a material is the fabric disclosed by U.S. Pat. No. 4,613,544.

In some embodiments, the vapor port may include a support member, which may support a more flexible part of the vapor port (e.g., a fabric or thin film waterproof/breathable membrane, etc.). The support member may be substantially rigid or rigid, and secure peripheral edges of a waterproof/breathable membrane in place within an aperture, seam or other passage through the housing of an electronic device. Alternatively, the support member may extend at least partially across an opening or other passage that defines a portion of the vapor port. The rigid member includes one or more openings therethrough, and may comprise a mesh or any other suitable grid or grid-like structure. Openings through such an embodiment of rigid member may be too small for drops and droplets of a liquid, such as water, to pass therethrough, but large enough for a vapor, such as water vapor, to pass therethrough.

As is well known, an electronic device, or its components, may generate heat during operation. When the temperature of the electronic device or one or more of its components increases, moisture inside the electronic device may be vaporized. As the temperature within the electronic device increases, pressure within the housing also increases. The increase in pressure may force the vapor through one or more vapor ports and, thus, out of the interior of the electronic device. Thus, a vapor port may prevent any vapor within the interior of the electronic device from condensing on the interior surfaces of the electronic device and/or on its components as the electronic device and its components cool.

In some embodiments, an electronic device may also include a moisture gathering element (e.g., a dessicant, a sponge-like structure, etc.) that collects moisture within the interior of the electronic device. The moisture gathering element may be situated proximate to a component that is heated (i.e., experiences an increase in temperature) during operation of the electronic device (e.g., a component of the electronic device, a heat sink, etc.). Thus, as the temperature of the adjacent component increases, moisture held by the moisture gathering element may be vaporized. As pressure builds within the interior of the electronic device, the vapor may be forced through a vapor port and, thus, out of the interior of the electronic device.

Other aspects, as well as features and advantages of various aspects, of the disclosed subject matter will become apparent to those of ordinary skill in the art from the ensuing description, the accompanying drawings and the appended claims.

DETAILED DESCRIPTION

Figure 1:
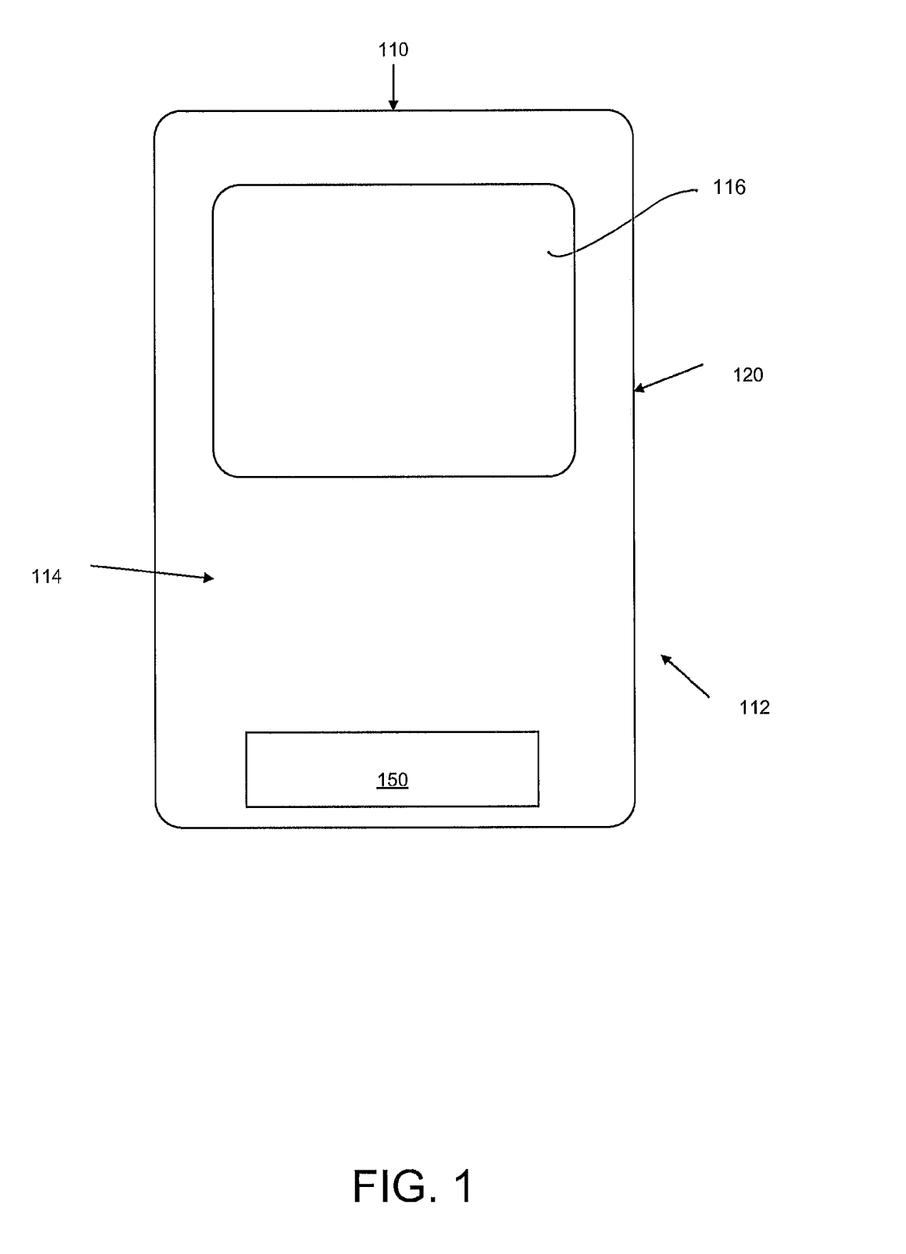
FIG. 1 is a representation of an embodiment of an electronic device having a housing and a vapor port.
Figure 2:
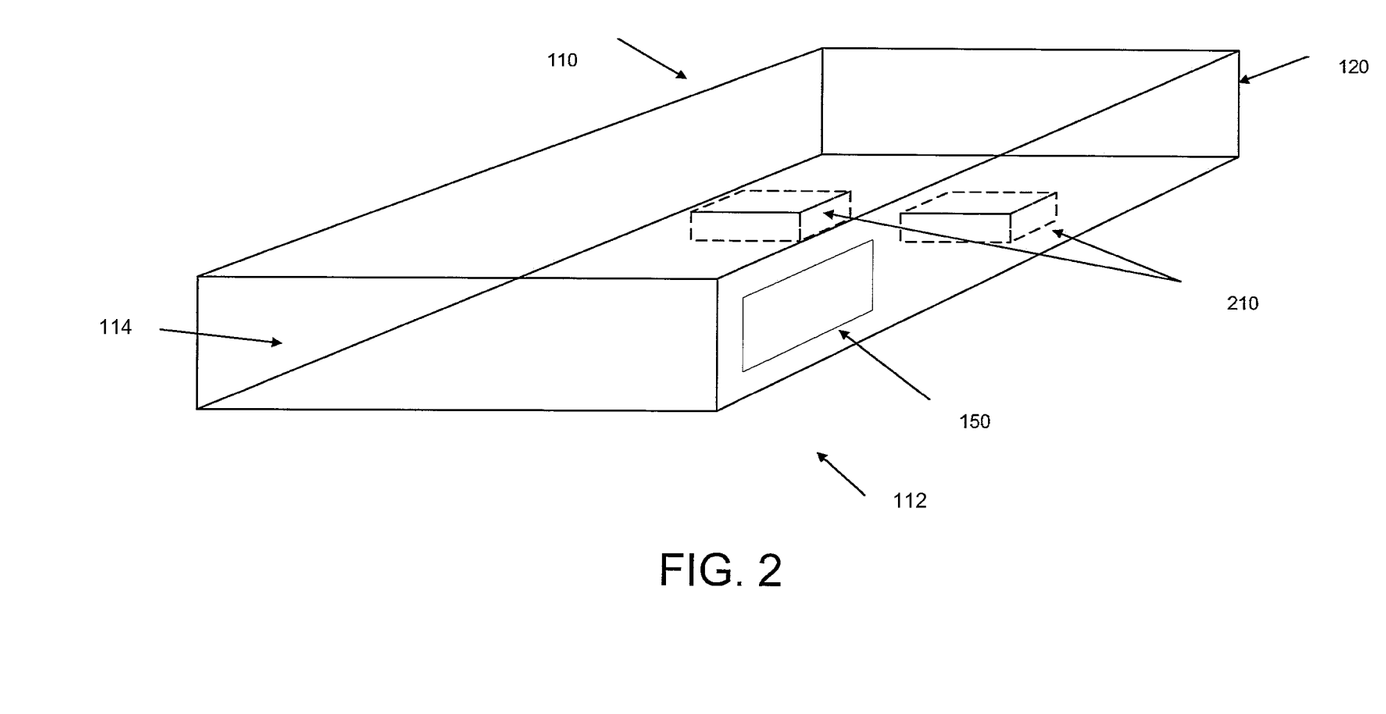
FIG. 2 is a representation of an interior and an exterior of an electronic device having a vapor port.

FIGS. 1 and 2 illustrate an embodiment of an electronic device 110 that includes at least one vapor port 150. The electronic device 110 includes one or more components 210 (e.g., a processor, memory for storing and executing instructions, as well as one or more user interface components (e.g., an on/off button, volume buttons, a touch screen 116, etc.), a power supply, and/or one or more communication elements (e.g., ports, wireless communication components, etc.), among other features. At least some components 210 of the electronic device 110 may be at least partially covered with a protective coating (not shown) (e.g., a poly(p-xylene), or parylene, coating; etc.). The electronic device 110 may be a portable electronic device, such as a tablet computer, a cellular telephone, a digital media player or the like.

The electronic device 110 includes a housing 120. The housing 120 defines an exterior 112 of the electronic device 110, as well as an interior 114 of the electronic device 110. The housing 120 may directly or indirectly carry other components 210 of the electronic device 110.

In some embodiments, the housing 120 of the electronic device 110 may not be moisture-tight (e.g., watertight, etc.). For example, the housing 120 may include one or more seams (e.g., at location where elements of the housing 120 are assembled with one another; with other components, such as a display, buttons or ports; etc.), ports (e.g., a micro Universal Serial Bus (USB) port, a headphone jack, one or more speakers, one or more microphones, etc.) or other features that enable moisture to enter into the interior 114 of the electronic device 110. If the electronic device 110 is exposed to liquid, the liquid may undesirably enter into the interior 114 of the electronic device 110 and, when present within the interior, moisture may interfere with proper operation of one or more components of the electronic device 110 (e.g., it may cause electrical shorting, etc.), it may cause corrosion, or it may otherwise undesirably affect the electronic device 110 or its operation. Complicating the problem of moisture ingress into the interior 114 of an electronic device 110 is the fact that the housings 120 of many state-of-the-art electronic devices are not easily opened by the user, and removing moisture from the interior of an electronic device can, therefore, be difficult.

The housing 120 and externally accessible features of the electronic device 110 may be sealed to prevent moisture from entering into the housing 120 and, thus, to prevent moisture from entering into the interior 114 of the electronic device 110. Nonetheless, it may still be possible for potentially damaging moisture (e.g., in liquid form, etc.) to find its way into the interior 114. Regardless of whether or not the housing 120 of an electronic device 110 is moisture-tight—even when components 210 of the electronic device 110 are covered with a protective coating—it may be desirable to provide a mechanism by which moisture may be removed from, or escape, the interior of an electronic device 110.

An electronic device 110 may include one or more protective coatings that cover surfaces within the interior 114 of the electronic device 110, such as surfaces of one or more components 210 that are exposed to the interior of the electronic device 110. Nonetheless, over time, protected moisture-sensitive components 210 may still be exposed to moisture, which may find its way through or beneath a protective coating. As indicated previously herein, an electronic device 110 according to this disclosure may be equipped with at least one vapor port 150. The vapor port 150 may be configured to prevent the ingress of liquid into the interior 114 of the electronic device 110. The vapor port 150 may also be configured to permit the egress of vapor out of the interior 114 of the electronic device 110. The vapor port 150 may thus allow moisture to be readily and effectively removed from the interior 114 of the electronic device 110.

The vapor port 150 may define a passage through the housing 120 of the electronic device 110, between the exterior 112 and the interior 114 of the electronic device 110. The vapor port 150 may include a barrier 314 (e.g., a membrane, a fabric, etc.) that entirely covers an aperture, seam or other passageway through which liquid moisture may tend to flow into the housing 120.

The barrier 314 may comprise a so-called "waterproof/breathable" element 402 that entirely covers the aperture. The barrier 314 may function as a moisture-proof (e.g., waterproof, etc.) element by preventing liquid from entering the interior 114 of the electronic device 110 through the vapor port 150. The breathable, or vapor permeable functionality of the barrier 314 enables vapor to exit the interior 114 of the electronic device 110 through the vapor port 150.

The barrier 314 may be configured to prevent ingress of liquid through the vapor port 150 even when the electronic device 110 is completely submerged in the liquid. The depth to which the electronic device 110 may be submerged without liquid entering through the barrier 314 may vary. The barrier 314 may be constructed such that its moisture-resistance is at least 1,000 millimeters or more of water pressure (i.e., 9.8 kPa) without leaking. Alternatively, the barrier 314 may have a moisture-resistance of about three pounds per square inch (psi) to about five psi of water pressure. In other embodiments, the barrier 314 has a moisture-resistance of about 20 psi to about 40 psi of water pressure.

Figure 3:
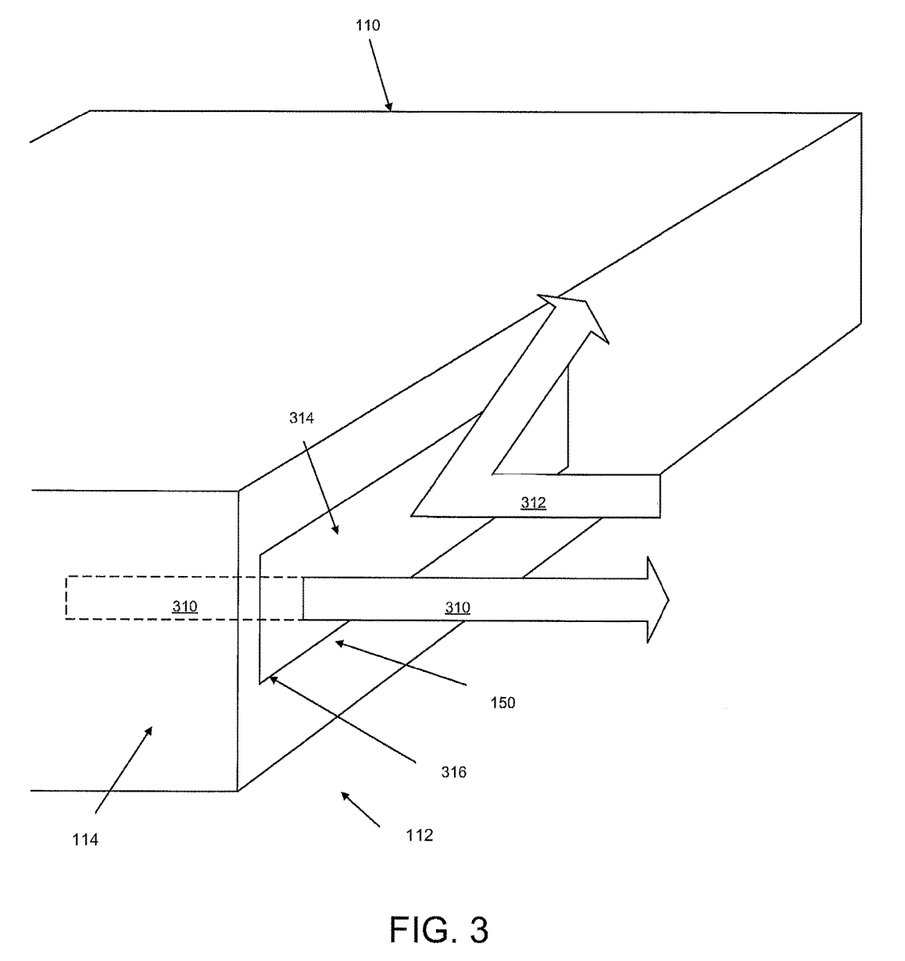
FIG. 3 is a representation of a vapor port preventing ingress of liquid and permitting egress of vapor.

FIG. 3 illustrates an embodiment of a vapor port 150 that includes an aperture 316 through a housing 120 of an electronic device 110. The vapor port 150 includes a barrier 314 that extends across the aperture 316. Vapor 310 within the interior 114 of the electronic device 110 can be removed from the interior 114 by passing through the barrier 314. In certain embodiments, the barrier 314 may also be configured to enable liquid within the interior 114 to pass therethrough.

Some embodiments of suitable vapor port 150 and barrier 314 configurations are provided below.

The vapor port 150 may also be configured to prevent moisture 312 on the exterior 112 of the electronic device 110 from entering into the interior 114 of the electronic device 110. The moisture 312 may be a liquid or a vapor.

Figure 4:
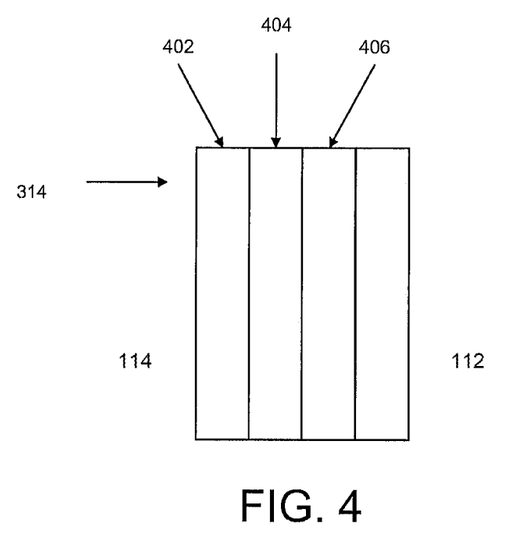
FIG. 4 is a block diagram illustrating one embodiment of a vapor port.

FIG. 4 illustrates an embodiment of a barrier 314. In the embodiment shown in FIG. 4, the barrier 314 includes a breathable element 402, a supporting and protecting element 404 and an optional waterproof cap or plug 406. The supporting and protecting element 404 may itself be breathable or not, vapor permeable or not, and waterproof or not, so long as it does not interfere with the breathability of the breathable element 402. The breathable element 402 enables the barrier 314 to effectively transport moisture from the interior 114 of the electronic device 110 to the exterior 112 of the electronic device 110. The breathable element 402 may comprise a laminate or a coating applied to the supporting and protecting element 404. The breathable element 402 may have openings that are large enough for vapor to pass therethrough, but too small for liquid to pass therethrough. The breathable element 402 may include a material that has a low surface energy relative to most liquids, such as water. As a result, liquid may bead on the surface of the barrier 314 rather than wet the surface.

The breathable element 402 may include expanded polytetrafluoroethylene (ePTFE), polyurethane (PU), polyester or any other suitable material. In a specific embodiment, the breathable element 402 may comprise a polyester film, such as a SYMPATEX® membrane available from Sympatex Technologies GmbH of Unterföhring, Germany, which combines a hydrophobic polyester and hydrophilic polyether to transport water vapor from the interior 114 of the electronic device 110 to the exterior 112 of the electronic device 110. The breathable element 402 may also include combinations of different materials. Optionally, the breathable element 402 may comprise a laminated structure (e.g., in the form of a fabric, etc.) including any of the foregoing materials or any combination of suitable materials. As another option, the breathable element 402 may comprise a hydrophilic element. For example, the breathable element 402 may be an ePTFE membrane infiltrated with polyurethane. The hydrophilic polyurethane may adsorb moisture within the interior 114 of the electronic device 110. The moisture may then diffuse through the polyurethane to the ePTFE membrane. The moisture, on the outer side of the polyurethane, may then evaporate and escape through the ePTFE membrane through a desorption process.

The breathable element 402 may include an oleophobic or lipophobic coating, in which the oleophobic or lipophobic material covers portions of the breathable element 402 without blocking apertures in it, thereby forming a hydrophobic and vapor permeable microporous element. The oleophobic or lipophobic coating may limit contamination of the breathable element 402, which might otherwise compromise the effectiveness of the breathable element 402 and, thus, of the barrier 314, at repelling water. eVent® waterproof fabric, available from General Electric Company, is one embodiment of a such a hydrophobic microporous element.

In other embodiments, the breathable element 402 may be a coating. The coating may be a microporous coating on the supporting and protecting element 404 that leaves channels too small for liquid water to penetrate, yet large enough for water vapor to escape through from the interior 114 of the electronic device 110. In other embodiments, the coating may be a monolithic coating that provides a unitary hydrophilic layer that uses an adsorption-diffusion-desorption approach to transport moisture from the interior 114 to the exterior 112 of the electronic device 110.

In embodiments where the breathable element 402 is a laminate or coating applied to a supporting and protecting element 404, it may be applied to the supporting and protecting element 404 in a thickness that may cause the supporting and protecting element 404 to be stiff, which may be a desirable feature for the vapor port 150.

In addition to the disclosed embodiments, the breathable element 402 of the barrier 314 may include any other suitable structure.

The breathable element 402 or the supporting and protecting element 404 may include a durable water resistant "DWR" coating on it, in which the coating covers portions of these elements without interfering with their respective breathability, and supporting and protecting functions. The DWR may be fluoropolymer based.

The barrier 314 may also include a supporting and protecting element 404 that provides structure and/or support for the breathable element 402. The supporting and protecting element 404, which may be integral with the breathable element 402 or visibly discrete therefrom, may reduce the possibility of damage to the breathable element 402. An embodiment of a supporting and protecting element 404 that is integral with the breathable element 402 may be selected to be abrasion-resistant and durable. A specific embodiment of an integral or combined, breathable element 402 and supporting and protecting element 404 comprises GORE-TEX® fabric. As another option, the supporting and protecting element 404 may be a vapor permeable nylon fabric. One or both of the breathable element 402 and the supporting and protecting element 404 may be removable, replaceable and/or disposable. Other suitable varieties of a supporting and protecting element 404 may also be used.

Visibly discrete embodiments of a supporting and protecting element 404 may comprise a vapor-permeable member, such as a mesh or other grid or grid-like structure. The supporting and protecting element 404 may, in one embodiment, comprise a plastic grid with numerous apertures large enough to allow liquid (e.g., water, etc.) to pass therethrough (e.g., from the interior 114 to the exterior 112 of the electronic device 110, etc.). Of course, other materials and configurations may also be used for the supporting and protecting element 404.

The supporting and protecting element 404 may be disposed on the exterior 112 side of the barrier 314 such that it forms an exterior of the vapor port 150. The supporting and protecting element 404, in such an embodiment, may protect those elements of the barrier 314 that are more easily damaged (e.g., the breathable element 402, etc.) or that may lose effectiveness if exposed to contaminants (e.g., oil, dirt, etc.). In other embodiments, the supporting and protecting element 404 may be disposed on the interior 114 side of the barrier 314. Alternatively, the supporting and protecting element 404 may be embedded within the barrier 314 or disposed between two or more layers of the breathable element 402 of a barrier 314.

An optional waterproof cap or plug 406 may be configured to be removably positioned over a vapor port 150 to seal or substantially seal the same.

In some embodiments, a vapor port 150 may include a barrier 314 that lacks a supporting and protecting element 404, as illustrated by FIG. 4.

As another alternative, the vapor port 150 may be constructed without a barrier 314. As an example, the vapor port 150 may include nano-apertures in the housing 120 itself; the nano-apertures may have dimensions (e.g., inner diameters, etc.) that enable water vapor to pass therethrough, but block the passage of liquid water therethrough. In such an embodiment, the section of the housing 120 having the nano-apertures may be referred to as the barrier 314.

Figure 5A:
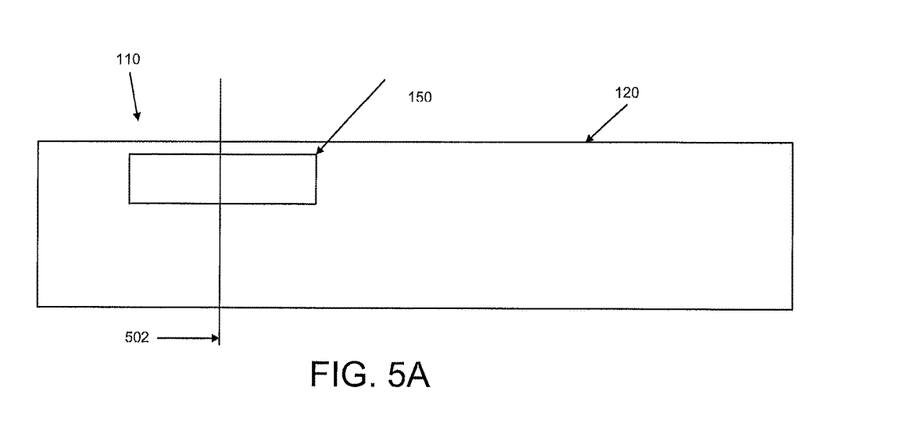
FIG. 5A is a representation of a side view of an electronic device having a vapor port.
Figure 5B:
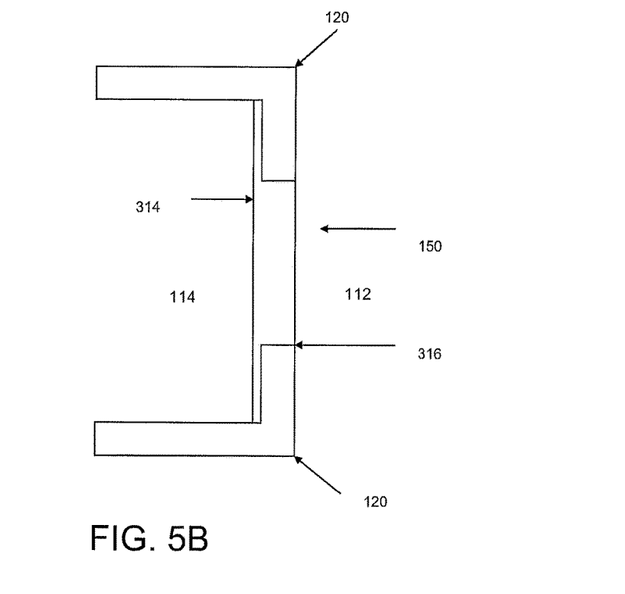
FIG. 5B is a cut-away view of an embodiment of a vapor port.

FIGS. 5A and 5B illustrate an embodiment of the manner in which a vapor port 150 may be constructed. FIG. 5A shows a side view of the electronic device 110 having a vapor port 150 in the housing 120. The vapor port 150 may be larger or smaller than that shown in connection with FIG. 5A. FIG. 5B illustrates a cut-away view of the vapor port 150 at the line 502 in FIG. 5A. FIG. 5B illustrates an aperture 316 through the housing 120 and a barrier 314 covering the aperture 316. The barrier 314 separates and is positioned between the interior 114 and the exterior 112 of the electronic device. In some embodiments, the barrier 314 may be essentially flush with an exterior side of the housing 120. In other embodiments, the barrier 314 may be recessed relative to the exterior surface of the housing 120. The barrier 314 may be secured within the housing 120 in any suitable manner (e.g., mechanically, chemically, etc.).

The barrier 314 may entirely cover the aperture 316 and prevent liquid from entering into the interior 114 of the electronic device 110. The barrier 314 may, therefore, be considered to be moisture-proof (e.g., waterproof, etc.). The barrier 314 may also be breathable, such that water vapor can pass out of the interior 114 of the electronic device 110 through the barrier 314 and thus escape the interior 114 of the electronic device 110 through the aperture 316.

In certain embodiments, as shown in FIGS. 5A and 5B, the vapor port 150 is a dedicated port for allowing egress of vapor from the interior 114 of the electronic device 110. In other embodiments, the vapor port 150 may comprise an existing passageway into and out of the housing 120 of the electronic device 110. For example, the housing 120 may include one or more seams, which may serve as vapor ports 150. In such an embodiment, the electronic device 110 may have waterproof and breathable material acting as a barrier 314 that is disposed across one or more moisture-permeable seams. As a result, the barrier 314 may resist entry of (at least) liquid into the interior 114 of the electronic device 110, but allow (at least) vapor to escape the interior 114.

In another embodiment, the housing 120 may include one or more apertures associated with speakers, microphones or other components of the electronic device 110. The aperture for one or more such components may be covered with a barrier 314 that resists ingress of (at least) liquid water and permits egress of (at least) water vapor, allowing these apertures to function as vapor ports 150.

Figure 6A:
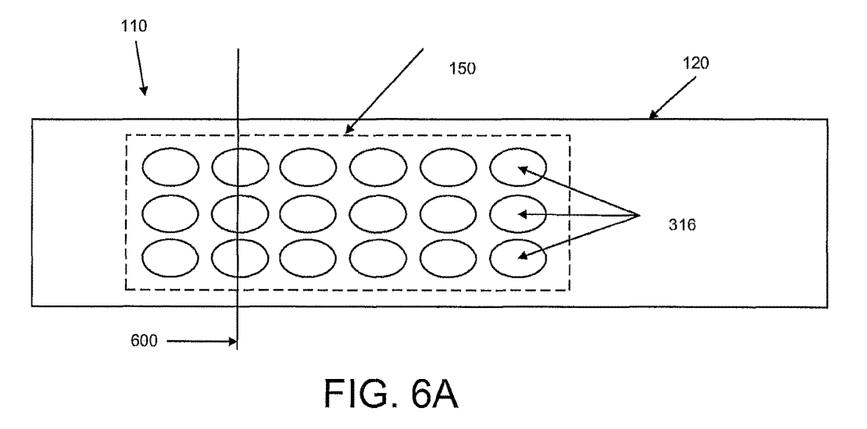
FIG. 6A is a representation of a side view of another embodiment of a vapor port.
Figure 6B:
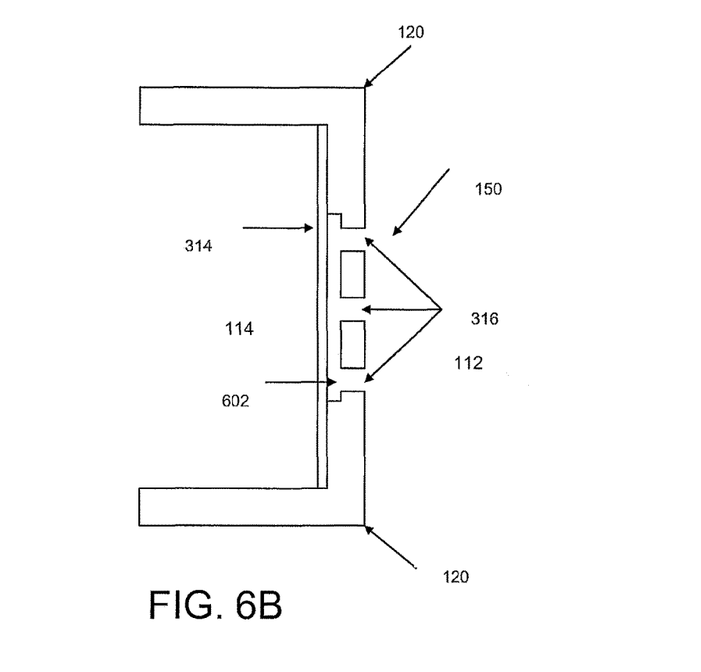
FIG. 6B is a cut-away view of the embodiment of a vapor port shown in FIG. 6A.

FIGS. 6A and 6B illustrate a cutaway view of another embodiment of a vapor port 150. In the embodiment shown in FIGS. 6A and 6B, the vapor port 150 includes multiple apertures 316. The size and number of the apertures 316 may vary from what is shown in FIGS. 6A and 6B. Similarly, the location of the vapor port 150 on the housing 120 may vary from the location shown in FIGS. 6A and 6B.

FIG. 6B is a cut-away view of the vapor port 150 at the line 600 in FIG. 6A. In the illustrated embodiment, the vapor port 150 includes one or more apertures 316 through the housing 120. The housing 120 may also include a gap 602 between the barrier 314 and the section of the housing 120 forming each aperture 316. The embodiment shown in FIG. 6B may allow the vapor to pass through the barrier 314 from the interior 114 and accumulate in liquid form in the gap 602, at which point the liquid may exit through the apertures 316. The embodiment shown in FIG. 6B may also provide additional protection for the barrier 314 by recessing it from the exterior surface of the housing 120. The barrier 314 may be less likely to accumulate dirt, be punctured or otherwise be compromised.

In another embodiment, the barrier 314 may be positioned against the portions of the housing 120 that define apertures 316, such that no gap 602 is present between the interior surface 114 of the housing 120 and the adjacent surface of the barrier 314. Such an embodiment may still provide sufficient ventilation for effective removal of moisture through the barrier 314.

Figure 7:
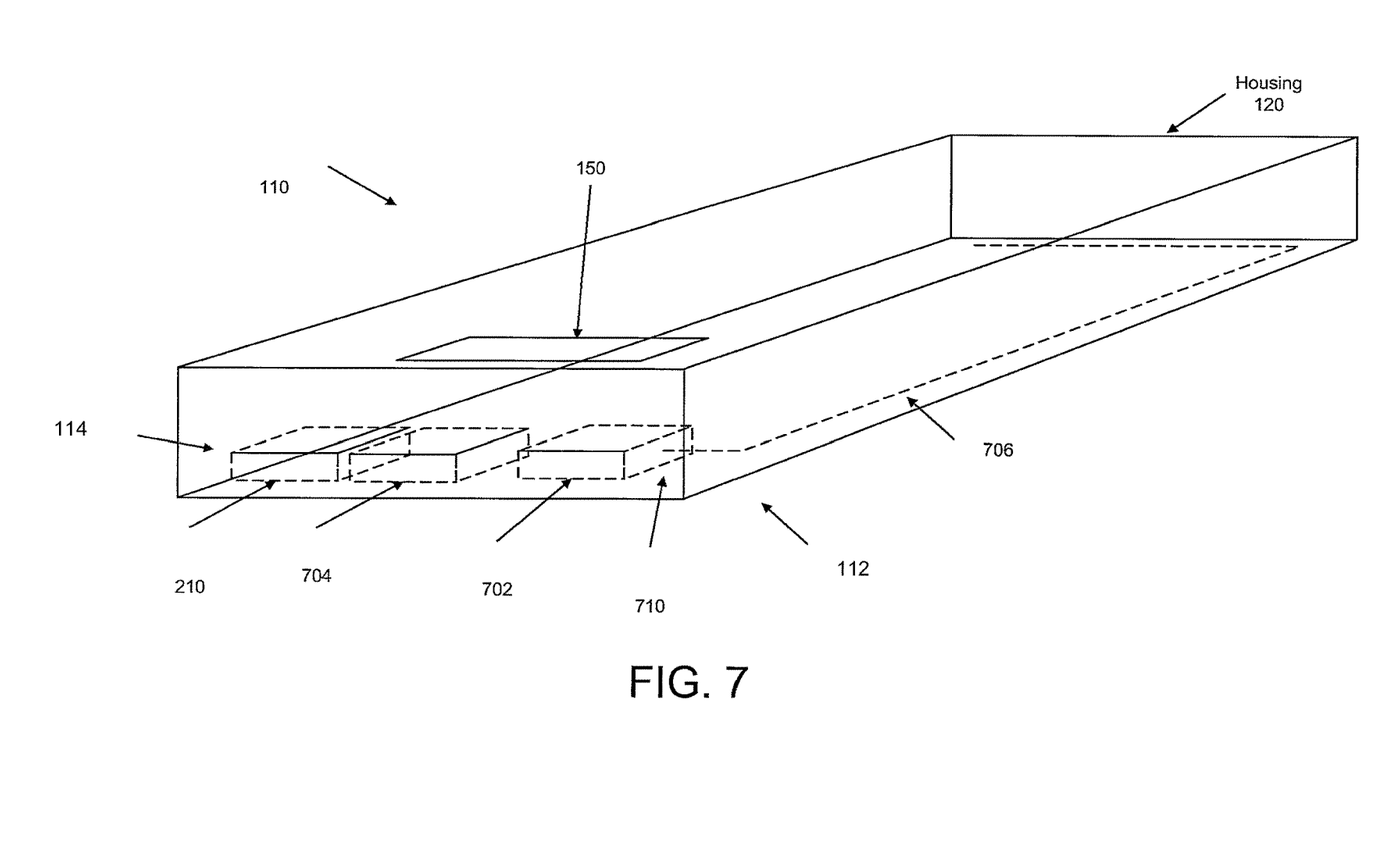
FIG. 7 is a representation of an electronic device having a vapor port and a moisture gathering element.

FIG. 7 shows an embodiment of an electronic device 110 with a vapor port 150 positioned adjacent to an element of the electronic device 110 that is heated to an elevated temperature during operation of the electronic device 110. In certain embodiments, such as that shown in FIG. 7, the electronic device 110 may include a heat sink 704 that aids in dissipating heat within the electronic device 110. The vapor port 150 may be disposed proximate to the heat sink 704. Having the vapor port 150 proximate to the heat sink 704 may facilitate transfer of vapor through the vapor port 150. Similarly, the electronic device 110 may have components 210 that generate sufficient heat during operation of the electronic device 110. The vapor port 150 may be disposed at a location that, on average, generates the highest levels of heat.

The electronic device 110 may be further configured with a moisture gathering element 710 that collects moisture within the electronic device 110. The moisture gathering element 710 may be configured to retain moisture within the electronic device 110. The moisture gathering element 710 may include a reservoir 702 that can retain moisture within the interior 114 of the electronic device 110, and that allows the moisture to vaporize and leave the reservoir 702. The reservoir 702 may, for example, include a sponge-like material. In another embodiment, the reservoir 702 is a space into which liquid within the electronic device 110 may pool.

The moisture gathering element 710 may be further configured to gather moisture within the interior 114 of the electronic device 110 to the reservoir 702. The moisture gathering element 710 may include, for example, capillaries 706 disposed in the interior 114 of the electronic device 110. The capillaries 706 may collect and transport liquid within the interior 114 such that the liquid moves towards the reservoir 702 by way of capillary action. Other suitable materials that can collect and transport liquid may also be used to direct moisture into the reservoir 702 of a moisture gathering element 710.

The moisture gathering element 710 may be situated within the interior 114 of the electronic device 110 proximate to one or more components 210 that are heated to an elevated temperature during operation of the electronic device 110, such as a heat sink 704. Such a configuration may enable evaporation of moisture in the reservoir 702 and removal of the moisture from the interior 114.

Figure 8:
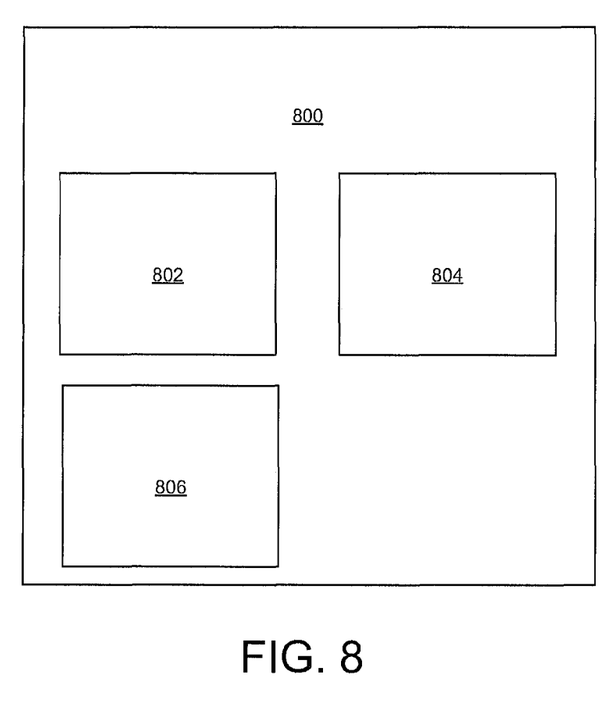
FIG. 8 is a schematic block diagram illustrating an embodiment of a vapor apparatus for an electronic device.

FIG. 8 illustrates one embodiment of a vapor apparatus 800. The vapor apparatus 800 may be embodied as software, firmware, hardware, or some combination thereof in the electronic device 110. The vapor apparatus 800 may include computer-readable instructions executable by a processor and stored within a tangible computer-readable storage medium.

The vapor apparatus 800 may include a sensor 806 that detects moisture levels within the interior 114 of the electronic device 110. The instruction module 802 may provide a user of the electronic device 110 with instructions to follow if the sensor 806 detects a moisture level within the interior 114 that is too high. The instruction module 802 may display the instructions on a display of the electronic device 110, provide audio instructions through speakers of the electronic device 110, send a message containing instructions to another electronic device or use another approach to communicate the instructions to the user.

The instruction module 802 may instruct the user to situate the electronic device 110 in a position that maximizes removal of moisture from the interior 114 of the electronic device 110. For example, the user may be instructed to position the electronic device 110 with the front face up and on an angle such that moisture within the interior 114 flows towards the reservoir 702. The user may be further instructed to ensure that the vapor port 150 is unobstructed. The instruction module 802 may alert the user when the moisture level within the interior 114 of the electronic device 110 reaches an acceptable level.

The vapor apparatus 800 may also include a vapor module 804. The vapor module 804 may place the electronic device 110 in an exposure mode in response to the sensor 806 detecting a moisture level within the interior 114 that is above a threshold moisture level. The vapor module 804 may power off one or more components 210 of the electronic device 110. For example, the vapor module 804 may cause the electronic device 110 to restart in a safe mode.

The vapor module 804 may take further steps to aid in removal of moisture from the interior 114 of the electronic device 110. In one embodiment, the vapor module 804 causes one or more components 210 to perform operations that generate heat. The vapor module 804 may thus increase the temperature in the interior 114 of the electronic device 110 and evaporate moisture therein. The vapor module 804 may also cause one or more fans of the electronic device 110 to operate at a high speed to increase circulation and further facilitate removal of vapor from the interior 114 of the electronic device 110.

The following application makes reference to one or more modules. A module refers to a component for executing one or more functions. A module may be realized as hardware, firmware, software or a combination thereof. The module may include one or more instructions that are stored in one or more memory locations and that are executable by a processor. These instructions may be stored in the same storage unit, or dispersed across separate storage units. The module may be stored in volatile and/or non-volatile memory. The module may be realized as a computer program product stored on a computer-readable storage medium. The computer-readable storage medium may be any tangible storage medium, volatile and non-volatile, capable of storing a computer program product such as CD, DVD, RAM, ROM, Flash memory and others.

Where the module comprises executable instructions, the module may be stored by different components in a computing system and the instructions may be executed by different components within the computing system. For example, a single module may include instructions executable by a general purpose central processing unit (CPU) and instructions executable by a microcontroller within the computing system. Representations of a module as a block within the drawings of this application are for convenience, and are not meant to imply that the module is a single hardware unit separate from other hardware units in the computing system.

Although the foregoing description contains many specifics, these should not be construed as limiting the scope of the disclosed subject matter, but merely as providing illustrations of some embodiments of the disclosed subject matter. Similarly, other embodiments may be devised which do not depart from the spirit or scope of the disclosed subject matter. Features from different embodiments may be employed in combination. The scope of each claim is, therefore, indicated and limited only by its plain language and the legal equivalents to its elements, rather than by this disclosure. All additions, deletions and modifications to the subject matter, as disclosed herein, which fall within the meaning and scopes of the claims are to be embraced thereby.

What is claimed:

1. An electronic device comprising:
a housing defining an exterior of the electronic device and an interior of the electronic device;
a plurality of components within the interior of the electronic device, wherein one or more of the components generate heat when the electronic device is in use;
a vapor port in the housing, the vapor port preventing ingress of liquid through the vapor port from the exterior of the electronic device to the interior of the electronic device, and permitting egress of vapor through the vapor port from the interior of the electronic device to the exterior of the electronic device, the vapor port comprising:
an aperture;
a breathable element covering at least a portion of the aperture and allowing vapor to exit the interior of the electronic device through the aperture; and
a support element providing structure and support for the breathable element, the support element being discrete from the breathable element, wherein the support element comprises a grid with a plurality of apertures to allow liquid to pass therethrough, and wherein the breathable element comprises a coating applied to the support element; and
a liquid gathering element that collects liquid within the interior of the electronic device proximate to the one or more components that generate heat.

2. The electronic device of claim 1, wherein the vapor port further comprises a waterproof element, the waterproof element facing the exterior of the electronic device, and a breathable element facing the interior of the electronic device.

3. The electronic device of claim 1, wherein the vapor port is disposed on a front face of the electronic device.

4. The electronic device of claim 1, the vapor port comprising a material having apertures too small for liquid water to pass through and large enough for water vapor to pass through.

5. The electronic device of claim 1, wherein the electronic device further comprises:
one or more water-permeable seams; and
a waterproof and breathable material disposed along the one or more water-permeable seams and sealing the one or more water-permeable seams.

6. The electronic device of claim 1, wherein the vapor port comprises an expanded polytetrafluoroethylene laminate.

7. The electronic device of claim 1, wherein the vapor port comprises a polyurethane film.

8. The electronic device of claim 1, wherein the vapor port is treated with a water repellent.

9. The electronic device of claim 1, the vapor port comprising a hydrophilic monolithic interior surface.

10. The electronic device of claim 9, the vapor port further comprising a hydrophobic microporous membrane.

11. The electronic device of claim 1, further comprising:
a moisture resistant coating on an interior surface of at least one component of the plurality of components.

12. The electronic device of claim 1, wherein the housing comprises a moisture proof housing including at least one seal to prevent moisture from entering into the interior of the electronic device.

13. A housing for an electronic device comprising:
a plurality of faces defining an exterior of the electronic device and an interior of the electronic device;
an aperture through the housing that defines a passage between the exterior of the electronic device and the interior of the electronic device;
a plurality of components within the interior of the electronic device, wherein one or more of the components generate heat when the electronic device is in use;
a liquid gathering element that collects liquid within the interior of the electronic device proximate to the one or more components that generate heat; and
a membrane entirely covering the aperture of the electronic device, the membrane comprising:
a waterproof element entirely covering the aperture and preventing liquid from entering the interior of the electronic device through the aperture; and
a breathable element covering at least a portion of the aperture and allowing vapor to exit the interior of the electronic device through the aperture;
a support element providing structure and support for the breathable element, the support element being discrete from the breathable element, wherein the support element comprises a grid with a plurality of apertures to allow liquid to pass therethrough, and wherein the breathable element comprises a coating applied to the support element.

14. The housing of claim 13, wherein the breathable element is a fabric.

15. The housing of claim 14, wherein the breathable element includes a water repellent finish.

16. The housing of claim 14, wherein the fabric comprises one of a laminate applied to an interior of the fabric and a coating applied to the exterior of the fabric.

17. An electronic device comprising:
a housing defining an exterior of the electronic device and an interior of the electronic device;
a plurality of components within the interior of the electronic device;
a vapor port, wherein the vapor port is situated proximate to a heat sink of the electronic device, the vapor port comprising:
one or more apertures in the housing;
a breathable element preventing ingress of liquid through the apertures of the vapor port from the exterior of the electronic device to the interior of the electronic device, and permitting egress of vapor through the apertures of the vapor port from the interior of the electronic device to the exterior of the electronic device;
a support element providing structure and support for the breathable element, the support element being discrete from the breathable element, wherein the support element comprises a grid with a plurality of apertures to allow liquid to pass therethrough, and wherein the breathable element comprises a coating applied to the support element; and
a liquid gathering element that collects liquid proximate to the heat sink.

18. The electronic device of claim 17, wherein the breathable element is recessed relative to the exterior of the housing.

19. The electronic device of claim 17, wherein the breathable element comprises an oleophobic element.

20. The electronic device of claim 17, further comprising:
a moisture resistant coating on an interior surface of at least one component of the plurality of components.

21. The electronic device of claim 17, wherein the housing comprises a moisture proof housing including at least one seal to prevent moisture from entering into the interior of the electronic device.

* * * * *